United States Patent [19]

Frische et al.

[11] Patent Number: 4,848,643
[45] Date of Patent: Jul. 18, 1989

[54] PROCESS OF BONDING PLATES

[75] Inventors: Richard H. Frische, Phoenix, Ariz.; Tony L. Sherrer, Colorado Springs, Colo.

[73] Assignee: Honeywell Inc., Minneapolis, Minn.

[21] Appl. No.: 246,051

[22] Filed: Sep. 19, 1988

[51] Int. Cl.⁴ .............. B23K 31/02; H01L 41/08
[52] U.S. Cl. ......................... 228/121; 228/195; 228/263.12; 310/338; 310/346
[58] Field of Search ........... 228/239, 121, 122, 124, 228/195, 263.12; 310/338, 346

[56] References Cited

U.S. PATENT DOCUMENTS

| | | | |
|---|---|---|---|
| 3,281,174 | 10/1966 | Heil | 228/122 |
| 3,857,161 | 12/1974 | Hutchins | 228/122 |
| 4,077,558 | 3/1978 | Carlson et al. | 228/121 |
| 4,210,389 | 7/1980 | Burkhart et al. | 228/122 |
| 4,479,070 | 10/1984 | Frische et al. | 310/338 |
| 4,582,240 | 4/1986 | Lux et al. | 228/122 |

FOREIGN PATENT DOCUMENTS 204881 11/1983 Japan ................... 228/122

OTHER PUBLICATIONS

Belser, "Soldering to Thin Metal Films", A Review of Scientific Instruments, vol. 25, No. 2, pp. 180-183, Feb., 1954.

Primary Examiner—Richard K. Seidel
Assistant Examiner—Samuel M. Heinrich
Attorney, Agent, or Firm—Howard Paul Terry

[57] ABSTRACT

A process of bonding crystalline quartz plates in a plate assembly of a quartz crystal resonator is provided. The plate assembly includes a base plate, a resonator plate, a cover plate, a first silver and indium alloy layer between the base plate and the resonator plate, and a second silver and indium alloy layer between the resonator plate and the cover plate. The process of bonding the plates in the plate assembly includes the steps of depositing in sequence on base plate face and on the cover plate face, a layer of chromium, a layer of silver, and a layer if indium, and also includes the steps of depositing in sequence on two opposite faces of the resonator plate, a layer of chromium, and a layer of silver, and also includes the steps in sequence of sandwiching the resonator plate between the base plate and the cover plate to form a plate assembly, then evacuating the plate assembly, compressing the plate assembly, and heating the plate assembly to about 310 degrees centigrade for several hours.

7 Claims, 5 Drawing Sheets

PROCESS OF BONDING PLATES

The invention generally relates to a process of bonding plates, and in particular the invention relates to a process of bonding crystalline quartz plates of a vibrating quartz diaphragm pressure sensor or a quartz crystal resonator using a silver and indium diffusion bond; and also relates to a process for bonding glasses and ceramics.

BACKGROUND OF THE INVENTION

The prior art vibrating quartz diaphragm pressure sensor is described in U.S. Pat. No. 4,479,070, issued Oct. 23, 1984.

The prior art process of bonding crystalline quartz plates of a vibrating quartz diaphragm pressure sensor uses nonmetallic materials, such as epoxies and frits and the like.

One problem with such nonmetallic materials is that they have organic carriers, which tend to outgas into vacuum cavities in the sensor, thereby causing stability problems. Another problem with such nonmetallic materials is that they are applied in layers of relatively large thickness, thereby causing relatively high bonding stresses and warping of the plates. Still another problem with such nonmetallic materials is that they have a thermal expansion coefficient which is substantially different from the thermal expansion coefficient of the plates, thereby causing additional bonding stresses and warping of the plates.

SUMMARY OF THE INVENTION

According to the present invention, a process is provided of bonding crystalline quartz plates in a resonator assembly having a first plate with a face and a second plate with a face. The process includes depositing a layer of chromium on the face of the first plate, depositing a layer of silver on the layer of chromium on the face of the first plate, depositing a layer of indium on the layer of silver on the face of the first plate, depositing a layer of chromium on the face of the second plate, depositing a layer of silver on the layer of chromium on the face of the second plate, positioning the face of the first plate towards the face of the second plate so that the indium layer on the first plate is separated by a gap from the silver layer on the second plate to form a plate assembly, evacuating the plate assembly, compressing the plate assembly, and heating the plate assembly at about 310 degrees centigrade for several hours.

By using metallic materials in the process of bonding the crystalline quartz plates of the plate assembly, the aforementioned problems of the prior art process using nonmetallic materials are avoided.

BRIEF DESCRIPTION OF THE DRAWINGS

The above advantages and subsequent description will be more readily understood by reference to the following drawings.

DESCRIPTION OF THE PREFERRED EMBODIMENTS

Figure 1:
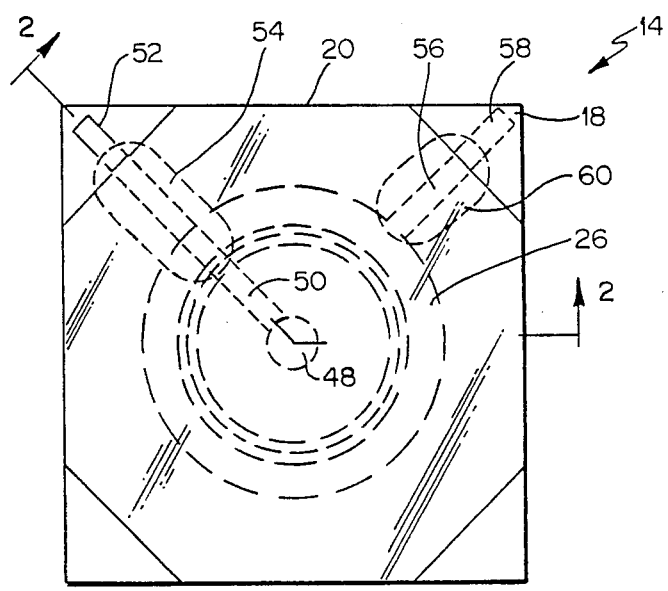
FIG. 1 is a plan view of a quartz crystal resonator assembly which is made by the process according to the invention.

In FIG. 1, a resonator assembly 14 which is made by a process according to the invention is shown. For ease of illustration and description, the structure of resonator 14 is explained first; and thereafter, the process of making resonator 14 is explained. Resonator 14 is the preferred embodiment of the structure, made by the process according to the invention.

Figure 2:
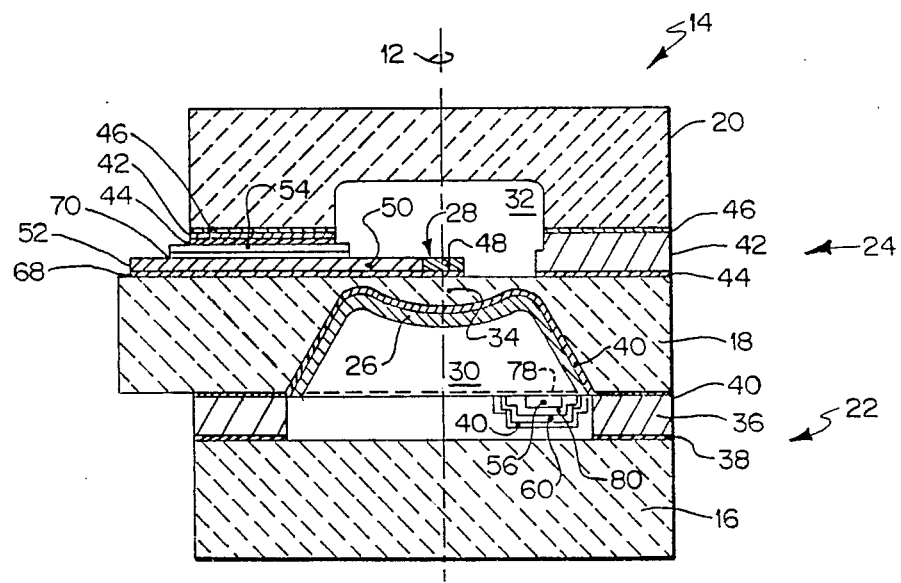
FIG. 2 is a section view as taken along the line 2—2 of FIG. 1.

In FIGS. 1 and 2, resonator 14, which has an axis 12, includes a first lower slab or base plate 16, a second middle slab or diaphragm plate 18, a third upper slab or cover plate 20, a first lower bonded metalization or alloy layer 22 disposed between plates 16 and 18, and a second upper bonded metalization or alloy layer 24 disposed between plates 18 and 20. Resonator 14 also has a first lower resonator electrode 26 and a second upper resonator electrode 28. Resonator 14 also has a first lower chamber 30, and a second upper chamber 32.

In FIG. 2, diaphragm plate 18 has a resonant element 34. Lower metal layer 22 includes crystal aggregate layer 36 and adherence layers 38 and 40. Upper metal layer 24 includes crystal aggregate layer 42 and adherence layers 44 and 46. Upper electrode 28 includes upper gold electrode center portion 48, and upper gold conducting strip 50 and upper gold contact pad 52. Lower electrode 26 has a lower gold conducting strip 56 and lower gold contact pad 58.

In FIG. 2, diaphragm plate 18 has a lower face, which has a contact surface that engages a portion of lower adhesive layer 40 that engages lower contact aggregate layer 36, and which has a lower chamber surface that engages a portion of lower adhesive layer 40 that engages lower resonator electrode 26. Diaphragm plate 18 also has an upper face, which has a contact surface that engages a portion of upper adhesive layer 44 that engages upper crystalline aggregate layer 42, and which has an upper chamber surface that engages a portion 68 of upper adhesive layer 44 that engages upper gold electrode 48 and upper gold conductor strip 50.

In FIG. 2, the resonant element 34 is a plano-convex structure machined onto quartz plate 18. Top quartz plate 20 of similar crystal orientation, which contains cylindrical cavity area 32, is bonded onto the resonator plate 18 via the crystal aggregate layer 42 and adherence layers 44, 46. Gold electrode 48, gold conducting strip 50, and gold contact pad 52 are also thin film vacuum deposited onto resonator slab 18 over a chromium adhesion film portion 68 of layer 44. Electrical continuity is made between electrode 48, via conducting strip 50 to contact pad 52. Barrier layer 54 is aluminum oxide film overlaying a portion of conducting strip 50 to prevent indium from aggregate layer 42 from diffusing into gold. Adhesive layers 44, 70 provide bonding between layer 42, 54, and 50. The lump created by the gold conducting strip 50 and barrier 54 will be accommodated by the liquid indium during the diffusion process.

A similarly oriented bottom plate 16 is bonded to the bottom side of resonator plate 18. Gold electrode 26 is conductively coupled to gold contact pad 58 via conductive strip 56. Barrier layer 60 is aluminum oxide film overlaying conducting strip 56 to prevent indium from aggregate layer 36 from diffusing into gold. Adhesive layers 40, 80 provide bonding between layer 36, 60, and 56. Upper cavity 32 and lower cavity 30 have been left evacuated as a natural by-product of the bonding process. The resulting resonator structure is vacuum sealed, bonded together with a tensile strength of approximately 500 pounds per square inch, and electrically conductive between contact pads 52 and 58 at the resonant frequency of the resonant element 34.

Figure 3:
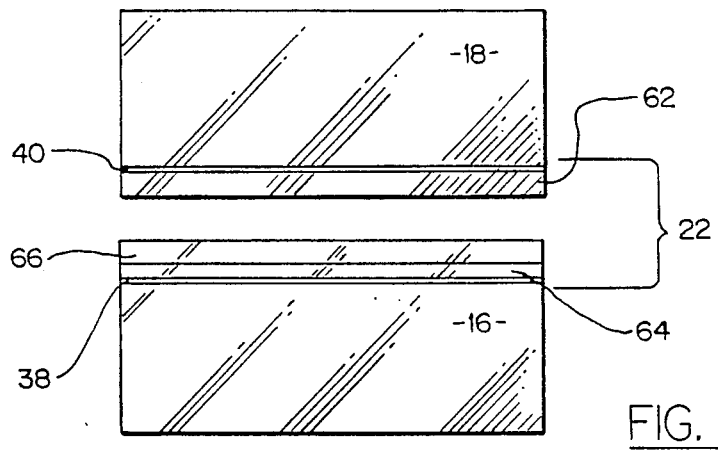
FIG. 3 is a disassembled partial elevation view of the resonator of FIG. 1.
Figure 4:
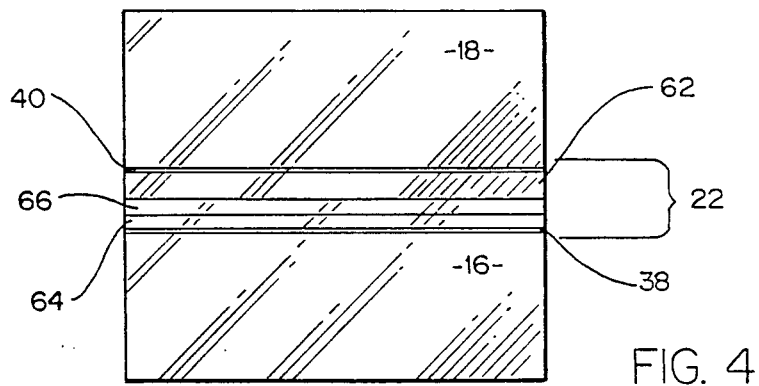
FIG. 4 is an assembled partial elevation view corresponding to FIG. 3 before heat treatment.
Figure 5:
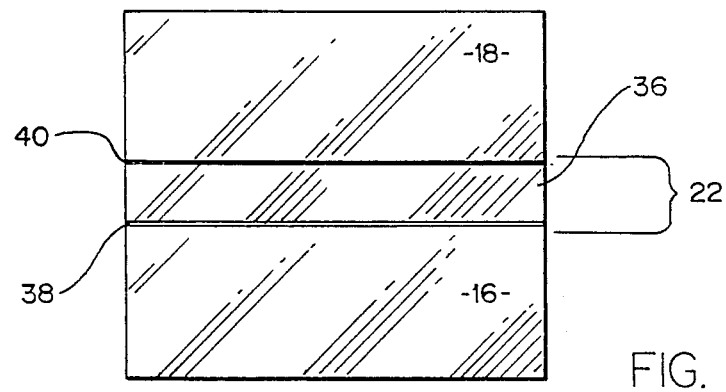
FIG. 5 is still another assembled partial elevation view corresponding to FIG. 4 after heat treatment.
Figure 6:
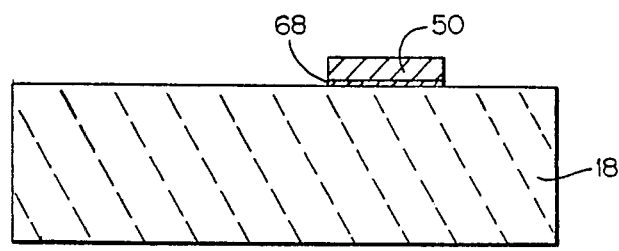
FIG. 6 is a schematic partial section view of a portion of FIG. 1.
Figure 7:
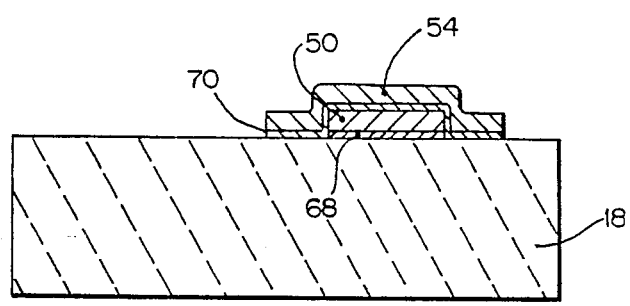
FIG. 7 is a schematic partial section view corresponding to FIG. 6.
Figure 8:
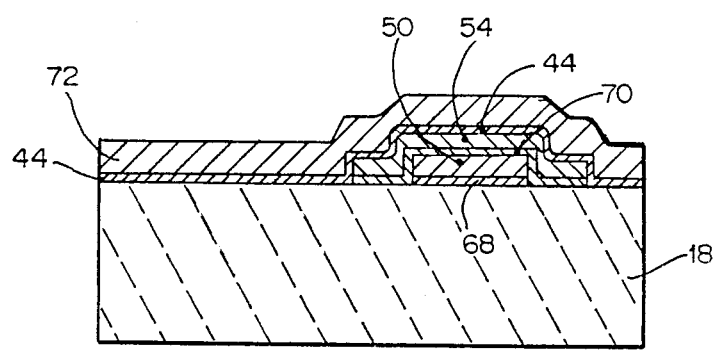
FIG. 8 is a schematic partial section view corresponding to FIG. 7.
Figure 9:
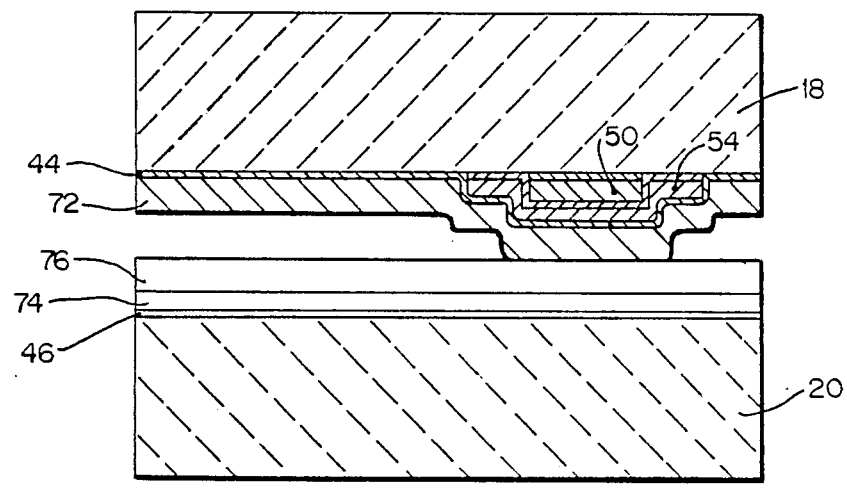
FIG. 9 is a schematic partial section view corresponding to FIG. 8 and FIG. 4 before heat treatment.

In FIGS. 3, 4, 5, in the process of the assembly of plates 16, 18, 20 of resonator assembly 14, plate 16 is bonded to plate 18; and plate 18 is bonded to plate 20. In the description below, the process steps of bonding plate 16 to plate 18 are explained in detail. The same process steps are used for bonding plate 18 to plate 20.

FIG. 3 shows the two crystalline quartz plates 16 and 18, that are intended to be bonded together as part of the quartz sensor structure or quartz resonator 14. The surfaces to be bonded are carefully prepared so as to be smooth, flat, and clean. Thin film metal is vacuum deposited on the clean surfaces as follows. Quartz slab 18 has a face with a contact surface which receives a thin layer of chromium 40 followed by a relatively thick layer of silver 62. The second, bottom quartz plate 16 also has a face with a contact surface which receives a thin layer of chromium 38 similar to that of plate 18. This is followed by a silver layer 64 and a layer of indium 66. The proportions of total silver 64 plus 62 and indium 66 are approximately seventy atomic percent silver and thirty atomic percent indium. The total thickness of silver 64 plus 62 and indium 66 needed for an optimum strength and hermetic bond is dependent upon the flatness and smoothness of the plates to be bonded, 16 and 18. Total thickness is typically less than 200 kiloangstroms (0.0008 inches). In the drawings, the thickness is exaggerated for ease of illustration.

In FIG. 3, with the completion of the thin film metal deposition, the quartz plates 16, 18 are loaded into a special fixture that holds the plates aligned for bonding but slightly separated from each other. The fixture with quartz plates 16 and 18 is placed in a vacuum furnace and pumped to a hard vacuum. After time for sufficient outgassing has passed, the quartz plates with the aid of the special fixture are pressed together, as shown in FIG. 4. The compression force need only be of a magnitude to ensure firm contact between silver film 62 on quartz plate 18 and indium film 66 on quartz plate 16. The temperature of the vacuum furnace is slowly raised to 310° C. To avoid warping of the bonded assembly, the temperature rise must be slow enough to avoid temperature gradients between quartz plate 18 and quartz plate 16. From FIG. 4, we see that initially the bond region consists of a layer of indium 66 contained between two layers of silver 62 and 64 and two layers of chromium 40, 38. The purpose of the chromium layers 40, 38 is to provide strong adherence between the silver layers 62 and 64 and the quartz plates 18 and 16, respectively. The chromium films 40, 38 do not take part in the diffusion process between the silver and indium layers.

Figure 11:
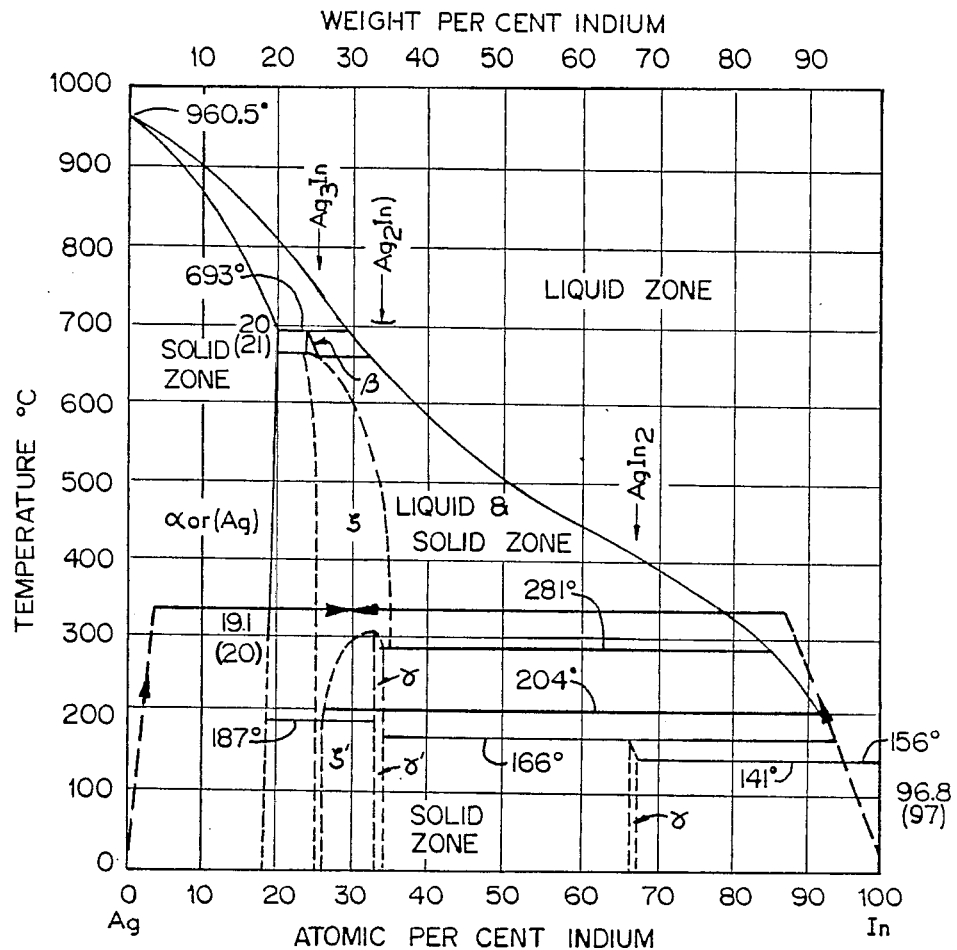
FIG. 11 is a two component phase diagram of silver and indium.

FIG. 11 is a two component phase diagram for silver and indium. Reference is also made to a diagram for silver and indium which is published in the book entitled, "Constitution of Binary Alloys" by Max Hansen, copyright 1958, McGraw-Hill Book Company. The diagram of FIG. 11, and the curve with arrows shown thereon, can be used to trace the composition path of the silver layers 62 and 64 starting from the left side of the diagram (Ag), and the indium layer 66 starting from the right side (In). One can start with indium 66 at room temperature at approximately 25° C. As the temperature slowly rises toward 310° C., some diffusion of silver into indium and indium into silver begins to take place.

In FIG. 11, as the temperature continues to rise, the indium 66 melts forming a liquid film. Melting starts at 141° C. (first liquid appears) and continues up to around 200° C. (last solid disappears) depending upon the extent of the diffusion at this point in the process. The temperature continues to rise to 310° C. where it is to be held constant. This temperature is held for a number of hours depending upon the thickness of the silver and indium layers 62, 64, and 66. When the liquid has dissolved sufficient silver so that its composition is approximately 80 atomic percent indium and 20 percent silver, solid crystals begin to form having a composition of thirty-five atomic percent indium and sixty-five atomic percent silver. At the same time the silver layers 62 and 64, originally in the alpha ($\alpha$) form, are acquiring atoms of indium. When the indium content reaches nineteen atomic percent, solid crystals of zeta ($\zeta$) begin to form within it that contain twenty-five atomic percent indium. As the diffusion process continues on the silver side, addition of indium eventually converts all the alpha to zeta. On the right or indium side, the addition of silver converts the liquid of eighty percent indium to solid zeta of thirty-five percent indium. Eventually, the liquid indium and silver are all converted to zeta which in time homogenizes to 30 atomic percent indium and 70 atomic percent silver. When the fixture and quartz plates are allowed to slowly cool below 300° C. some of the zeta phase ($\zeta$) converts to gamma phase ($\gamma$) that is 33 atomic percent indium. The remaining zeta phase ($\zeta$) is depleted of indium and approaches 26 atomic percent. As further cooling continues, the zeta ($\zeta$) and gamma ($\gamma$) phases convert to zeta prime ($\zeta'$) and gamma prime ($\gamma'$) which are the stable crystal aggregate layer 36 in FIG. 5.

Figure 10:
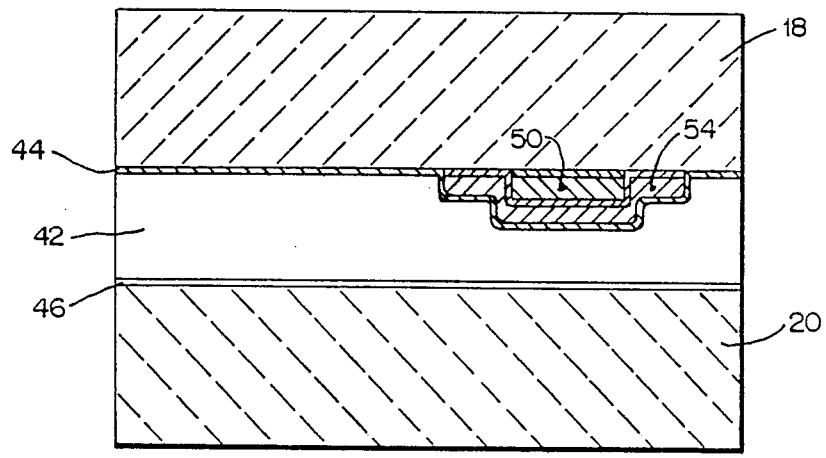
FIG. 10 is a schematic partial section view corresponding to FIG. 9 and FIG. 5 after heat treatment.

As shown in FIGS. 2 and 6 through 10, it is desirable to have a low resistance conducting strip 50 crossing through the bond area between external electrical contact pad 52 and internal electrode 28. Gold, which is a high conductivity metal, 50 is deposited on the quartz surface prior to the bonding deposition as in FIG. 6. Typical thickness of the gold conducting strip is 9000 Angstroms. Since indium has a very high affinity for gold and other high conductivity metals, it is necessary to cover it with a barrier layer 54 such as aluminum oxide, as in FIG. 7. 10,000 Angstroms is sufficient thickness for this barrier. In each case, an initial 500 Angstrom layer of chromium is laid down as an adhesive layer 68, 70. Finally a silver bonding layer 72 is deposited over the entire bond area, again with underlying adhesive layer 44 of chromium. The barrier layer 54 must cover the conducting layer 50 completely in areas where potential contact is possible with the silver 72 of the bond as in FIG. 7. At this point, the quartz plate 18 with conductive strip 50 and quartz plate 20 are bonded together as above. The quartz plates 18 and 20 are loaded in the bonding fixture. After sufficient time for outgassing has occurred the plates 18 and 20 are pressed together as in FIG. 9 and slowly heated. When the indium layer 76 reaches its melting temperature it liquifies and flows around the 20 kiloangstrom bump resulting from the added conducting material and barrier. After sufficient time for diffusion has elapsed the silver and indium form a crystal aggregate 42 as shown in FIG. 10. At the same time, plates 16 and 18 are pressed together and heated as above forming crystal aggregate 36 as shown in FIG. 2. It is noted that layers 68, 50, 70, 54, 44 of gold strip 50 correspond to layers 78, 56, 80, 60, 40 of gold strip 56.

In FIGS. 3, 4 and 5, therefore, the process of bonding plates 16, 18 in a plate assembly having a first plate 16 with a face and a second plate 18 with a face comprises the steps of, depositing a layer of chromium 38 on the face of the first plate 16, depositing a layer of silver 64 on the layer of chromium 38 on the face of the first plate 16, depositing a layer of indium 66 on the layer of silver 64 on the layer of chromium 38 on the face of the first plate 16, depositing a layer of chromium 40 on the face of the second plate 18, depositing a layer of silver 62 on the layer of chromium 40 on the face of the second plate 18, positioning the face of the first plate 16 towards the face of the second plate 18 so that the indium layer 66 on the first plate 16 is separated by a gap from the silver layer 62 on the second plate 18 to form a plate assembly, evacuating the plate assembly, compressing the plate assembly, and heating the plate assembly at about 310 degrees centigrade for several hours.

In summary, the subject invention utilizes thin film deposition technology to deposit multiple layers 38, 64, 66, 62, 40 of constituent materials on the surfaces of two or more flat substrates 16, 18 that are to be bonded together. The base layer 38, 40 deposited is a thin layer on non-reactive material that enhances the adhesion between subsequent layers 64, 62 and the substrate 16, 18. The subsequent layers 64, 66, 62 are the individual components in proportionate atomic percentages of defusable substances that upon heating will form a homogeneous, chemically and structurally stable bonding compound 22. When the substrate surfaces are sufficiently flat and polished, the thickness of the bond layer 22 can be as thin as hundreds of KA (hundreds of millionths of an inch) and appear hermetic at resolutions of $2 \times 10^{-11}$ std cc/sec helium leak rate. This very thin layer 22 will impose only very slight stresses on the bonded substrates 16, 18 over temperature even if the thermal expansion coefficients are not a good match. In the case of crystalline quartz plates, a good match is difficult because the thermal expansion coefficients are dependent upon direction in any given plane and can be widely variant.

The invention provides the advantages as indicated hereafter.

1. A silver indium bonding process is provided by which two or more parts may be joined to form a low stressed, electrically conductive, high strength hermetic assembly. This process is particularly useful in the assembly of piezoelectric quartz resonator devices constructed from multiple crystalline quartz plates 16, 18, 20 from which the resonators 34, vacuum cavities 30, 32, and supporting structure are formed.

2. The invention provides a process or method for bonding ceramic, glass, or nonmetallic crystalline plates together to obtain a structural, hermetic, low stress and electrically conducting bonded interface. This process is ideal for bonding together crystalline quartz structures, such as resonator assembly 14 and such as the vibrating quartz diaphragm pressure sensor, described in the aforementioned U.S. Pat. No. 4,479,070.

3. The invention provides a strong, hermetic, low stress bond between flat crystalline quartz plates 16, 18, 20, that form a quartz resonant assembly 14, entrapping evacuated reference chambers 30, 32, and creating a strong assembly without exceeding the quartz alpha-beta phase transition temperature of 573° C., and sustaining full integrity to operating temperatures in excess of 150° C.

While the invention has been described in its preferred embodiments, it is to be understood that the words which have been used are words of description rather than limitation and that changes may be made within the purview of the appended claims without departing from the true scope and spirit of the invention in its broader aspects.

For example, the constituent materials of the layers 22 and 24 are electrically conducting, so that the layers 22 and 24 can be used as electrical conductors and can form portions of modified electrodes.

As a further example, upper chamber 32 can have a fluid pressure opening for altering the frequency of the quartz crystal resonator as a measure of pressure magnitude.

The embodiments of an invention in which an exclusive property or right is claimed and defined are as follows.

1. The process of bonding plates in a plate assembly of a quartz crystal resonator including a base plate with a first face with a contact surface; a resonator plate with first and second faces with respective first and second contact surfaces, a cover plate with a first face with a contact surface, a first bonding layer disposed between the contact surfaces of the base plate and the resonator plate, and a second bonding layer disposed between the contact surfaces of the resonator plate and the cover plate, comprising:

depositing a layer of chromium on the contact surface of the first face of the base plate;

depositing a layer of silver on the layer of chromium on the contact surface of the first face of the base plate;

depositing a layer of indium on the layer of silver on the layer of chromium on the contact surface of the first face of the base plate;

depositing a layer of chromium on the contact surface of the first face of the resonator plate;

depositing a layer of silver on the layer of chromium on the contact surface of the first face of the resonator plate;

positioning the first face of the base plate towards the first face of the resonator plate so that the indium layer on the base plate is separated by a gap from the silver layer on the resonator plate;

depositing a layer of chromium on the contact surface of the first face of the cover plate;

depositing a layer of silver on the layer of chromium on the contact surface of the first face of the cover plate;

depositing a layer of indium on the layer of silver on the layer of chromium on the contact surface of the first face of the cover plate;

depositing a layer of chromium on the contact surface of the second face of the resonator plate;

depositing a layer of silver on the layer of chromium on the contact surface of the second face of the resonator plate;

positioning the first face of the cover plate towards the second face of the resonator plate so that the indium layer on the cover plate is separated by a gap from the silver layer on the resonator plate to form a plate assembly;

evacuating the plate assembly;

compressing the plate assembly; and heating the plate assembly to about 310 degrees centigrade for a selective time interval.

2. The process of claim 1, wherein the resonator plate and the cover plate have an upper chamber and the second face of the resonator plate has an upper chamber surface and the resonator plate and base plate have a lower chamber and the resonator plate has a lower chamber surface and the resonator plate has a resonator portion disposed between the lower chamber and the upper chamber, said process including:

while depositing the layer of chromium on the contact surface of the first face of the resonator plate, simultaneously depositing a layer of chromium on the lower chamber surface of the resonator plate, and then depositing a layer of gold film on the layer of chromium on the lower chamber surface; and while depositing a layer of chromium on the contact surface of the second face of the resonator plate, simultaneously depositing a strip of chromium on the upper chamber surface, and then depositing a strip of gold film of defined width and length over the chromium layer and strip.

3. The process of claim 2, including:

while depositing the layer of gold film on the layer of chromium on the lower chamber surface, simultaneously depositing a strip of gold film of defined width and length over a portion of the chromium layer on the contact surface adjacent to the lower chamber.

4. The process of claim 3, including:

depositing a barrier layer over each layer of gold film.

5. The process of claim 1, including:

before depositing the layer of chromium on the respective contact surface of the base plate and resonator plate and cover plate, polishing the contact surfaces of the base plate and resonator plate and cover plate.

6. The process of claim 2, including:

providing a fluid pressure opening in the upper chamber, for use of the plate assembly in a quartz crystal resonator of a pressure sensor and for applying a fluid pressure on the resonator plate thereby altering the frequency of the quartz crystal resonator as a measure of pressure magnitude.

7. The process of bonding plates in a plate assembly of a quartz crystal resonator having a first plate with a face and a second plate with a face and having a chamber therebetween with a chamber surface comprising:

depositing a layer of chromium on the face of the first plate;

depositing a layer of silver on the layer of chromium on the face of the first plate;

depositing a layer of indium on the layer of silver on the layer of chromium on the face of the first plate;

depositing a layer of chromium on the face of the second plate and simultaneously depositing a layer of chromium of defined length and width on the chamber surface;

depositing a layer of silver on the layer of chromium on the face of the second plate and then depositing a layer of gold film on the layer of chromium on the chamber surface;

positioning the face of the first plate towards the face of the second plate so that the indium layer on the first plate is separated by a gap from the silver layer on the second plate to form a plate assembly;

compressing the plate assembly; and heating the plate assembly to about 310 degrees centigrade for a selective time interval.

* * * * *